United States Patent
Tseng

(10) Patent No.: US 10,497,308 B1
(45) Date of Patent: Dec. 3, 2019

(54) SENSING CIRCUIT OF DISPLAY DRIVER

(71) Applicant: NOVATEK MICROELECTRONICS CORP., HsinChu (TW)

(72) Inventor: Po-Yu Tseng, Zhongli (TW)

(73) Assignee: NOVATEK MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 16/005,753

(22) Filed: Jun. 12, 2018

(51) Int. Cl.
| | |
|---|---|
| *H01L 27/32* | (2006.01) |
| *G06K 9/00* | (2006.01) |
| *G09F 9/30* | (2006.01) |
| *H05B 33/02* | (2006.01) |
| *G09G 3/3225* | (2016.01) |
| *G11C 27/02* | (2006.01) |
| *H03F 3/45* | (2006.01) |

(52) U.S. Cl.
CPC ......... *G09G 3/3225* (2013.01); *G11C 27/026* (2013.01); *H03F 3/45269* (2013.01); *G09G 2310/0291* (2013.01); *G09G 2310/0294* (2013.01); *G09G 2310/0297* (2013.01); *G09G 2310/08* (2013.01); *H03F 2203/45156* (2013.01)

(58) Field of Classification Search
CPC combination set(s) only.
See application file for complete search history.

(56) References Cited

U.S. PATENT DOCUMENTS

| | | |
|---|---|---|
| 2014/0368415 A1 | 12/2014 | Kim et al. |
| 2015/0091618 A1 | 4/2015 | Min et al. |
| 2015/0091888 A1 | 4/2015 | Min et al. |
| 2018/0114815 A1* | 4/2018 | Lee .................. G06K 9/00013 |

* cited by examiner

*Primary Examiner* — Deeprose Subedi
(74) *Attorney, Agent, or Firm* — McClure, Qualey & Rodack, LLP

(57) ABSTRACT

A sensing circuit is provided. The sensing circuit includes a sample and hold circuit and a gain amplifier. The sample and hold circuit includes a first charging path and a second charging path. The first charging path selectively generates a first charging potential between a first sensing terminal and a first reference terminal according to the analog voltage signal and a reference voltage. The second charging path selectively conducts the reference voltage to a second sensing terminal. A pair of differential input signals are generated at the first sensing terminal and the second sensing terminal. The first charging path and the second charging path are implemented by high voltage components. The gain amplifier receives the pair of differential input signals through a first and a second input terminals and generates a pair of differential output signals at a first and a second output terminals.

16 Claims, 9 Drawing Sheets

SENSING CIRCUIT OF DISPLAY DRIVER

BACKGROUND OF THE INVENTION

Field of the Invention

The invention relates in general to a sensing circuit, and more particularly to a sensing circuit capable of transforming an analog voltage signal to a low-voltage differential output signal.

Description of the Related Art

FIG. 1 is a schematic diagram illustrating operation of an OLED pixel circuit. An organic light-emitting diode (hereinafter, OLED) display panel includes OLED pixel circuits being arranged in a matrix, and a pixel circuit 17 located at an m-th column and n-th row can be represented as $PXL_{mn}$. The pixel circuit 17 is electrically connected to a source driver through an m-th data line $DL_m$ and an m-th sensing line $SL_m$, and to a gate driver through an n-th gate line $GL_n$. Both the source driver and the gate driver receive control signals specific to the pixel circuit 17 from a timing controller.

When the pixel circuit ($PXL_{mn}$) 17 is selected to display, the gate control signal being transmitted by the n-th gate line $GL_n$ switches on the transistor 17a, and the data signal being transmitted through the m-th data line $DL_m$ charges the pixel capacitor $C_{pxl}$. Once the cross voltage of the pixel capacitor $C_{pxl}$ is sufficient to turn on the transistor 17b, a pixel driving current $I_{drv}$ is generated for driving the OLED 17d.

Characteristics of the OLED 17d, for example, threshold voltage $V_{th}$, may shift or degrade with time passing, and a sensing mechanism for detecting status of the OLED 17d must be introduced. Voltage of the pixel terminal $N_{pxl}$ can stand the threshold voltage $V_{th}$ of the OLED17 when the switch 17c is switched on. Through the m-th sensing line $SL_m$, the source driver can detect and receive the threshold voltage $V_{th}$ of the OLED 17d.

The threshold voltage $V_{th}$ is an analog voltage signal and an analog-to-digital converter (hereinafter, ADC) needs to be equipped. However, range of the analog voltage signal is greater than operation voltage range of the ADC. Therefore, a technique for scaling down the detected threshold voltage $V_{th}$ to the low-voltage range of the ADC is desired. However, extra circuit and area are required for the scaling down techniques.

Assuming that the display panel includes M*N pixel circuits, the area needed by the source driver to detect statuses of all the M*N pixel circuits and scale down their detected threshold voltages $V_{th}$ can be numerous. Therefore, an effective area reducing approach is desired.

SUMMARY OF THE INVENTION

The invention is directed to a sensing circuit capable of transforming an analog voltage signal representing to the threshold voltage of the pixel circuit to the differential output signals to be converted by an analog-to-digital converter. The sensing circuit adopts some high voltage components so that a pair of differential input signals can be directly amplified and transformed into a pair of differential output signals, without using the scaling circuit.

According to an aspect of the present invention, a sensing circuit is provided. The sensing circuit includes a sample and hold circuit and a gain amplifier. The sample and hold circuit transforms an analog voltage signal corresponding to a pixel circuit to a pair of differential input signals. The sample and hold circuit includes a first charging path and a second charging path. The first charging path is configured to selectively generate a first charging potential between a first sensing terminal and a first reference terminal according to the analog voltage signal and a reference voltage. One of the pair of differential input signals is generated at the first sensing terminal. The second charging path is configured to selectively conduct the reference voltage to a second sensing terminal. The other one of the pair of differential input signals is generated at the second sensing terminal. The first charging path and the second charging path are implemented by high voltage components. The gain amplifier is electrically connected to the sample and hold circuit. The gain amplifier includes a first input terminal, a second input terminal, a first output terminal, and a second output terminal. The gain amplifier is configured to receive the pair of differential input signals through the first and the second input terminals and generate a pair of differential output signals at the first and the second output terminals.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
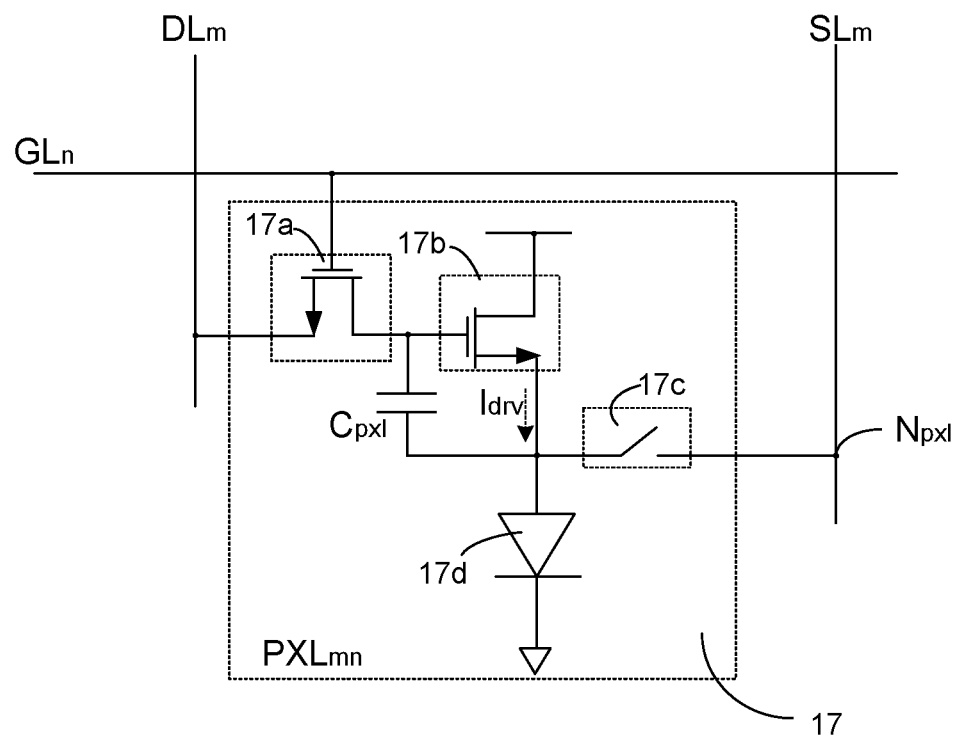
FIG. 1 (prior art) is a schematic diagram illustrating operation of an OLED pixel circuit.
Figure 2:
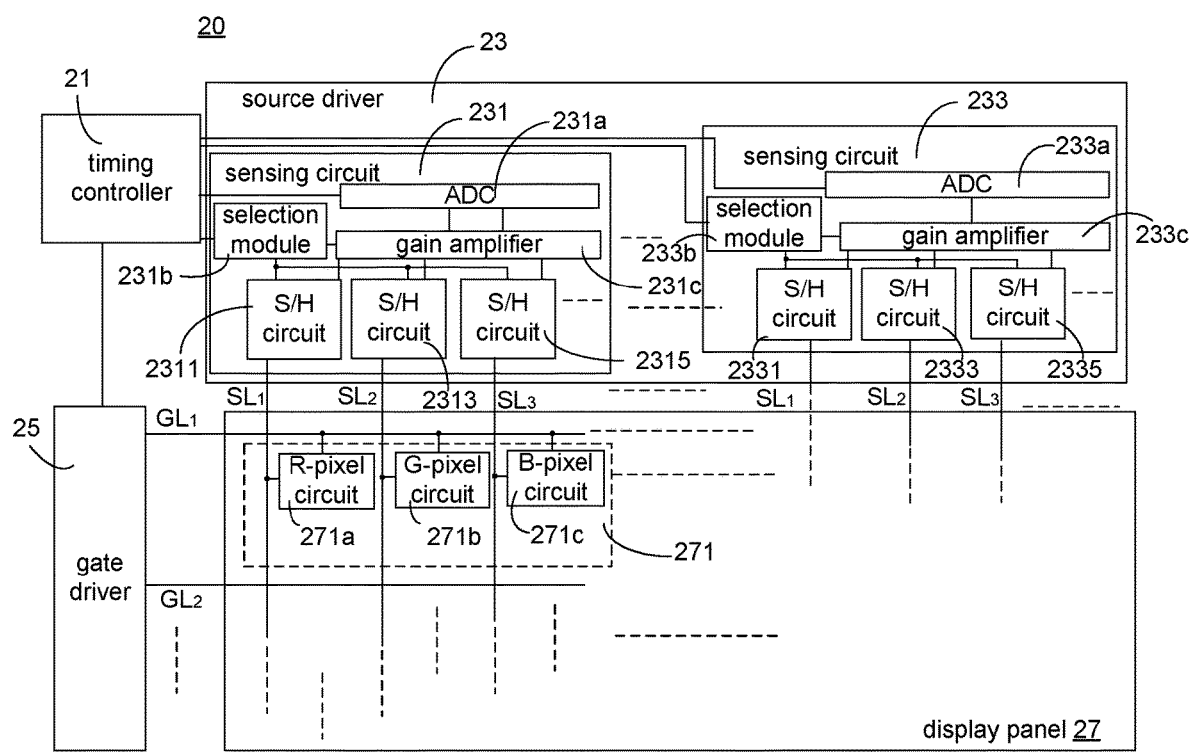
FIG. 2 is a schematic diagram illustrating components related to sensing threshold voltages $V_{th}$ of the pixel circuits in a display device.

FIG. 2 is a schematic diagram illustrating components related to sensing threshold voltages $V_{th}$ of the pixel circuits in a display device. The display device 20 includes a display panel 27, a source driver 23, a timing controller 21, and a gate driver 25. Both the timing controller 21 and the display panel 27 are electrically connected to the source driver 23 and the gate driver 25.

The display panel 27 display images with basic display elements 271 (pixels), and each of the basic display elements 271 includes an R-pixel circuit 271a, a G-pixel circuit 271b, and a B-pixel circuit 271c.

The source driver 23 may include one or multiple sensing circuits 231, 233, and each of the sensing circuits 231,233 further includes an ADC 231a, 233a, a selection module 231b, 233b, a gain amplifier 231c, 233c, and multiple sample and hold (hereinafter, S/H) circuits 2311, 2313, 2315, 2331, 2333, 2335. As the components and interconnections in the sensing circuits 231, 233 are similar, only the sensing circuit 231 is illustrated.

The S/H circuit 2311 receives a first-channel (ch1) analog voltage signal representing threshold voltage $V_{th(ch1)}$ of the OLED in the R-pixel circuit 271a through the sensing line $SL_1$. The S/H circuit 2313 receives a second-channel (ch2) analog voltage signal $V_{th(ch2)}$ representing threshold voltage $V_{th}$ of the OLED in the G-pixel circuit 271b through the sensing line $SL_2$. The S/H circuit 2315 receives a third-channel (ch3) analog voltage signal $V_{th(ch3)}$ representing threshold voltage $V_{th}$ of the OLED in the B-pixel circuit 271c through the sensing line $SL_3$.

According to the embodiment of the present disclosure, the number of sensing circuits 231 included in the source driver 23 is not limited. As shown in FIG. 2, the sensing circuits 231, 233 may include selection modules 231b, 233b so that amount of the ADCs 231a, 233a can be reduced and the hardware cost can be lowered. Each of the selection modules 231b, 233b includes a demultiplexer (demux) and several selection circuits. After receiving a selection control signal from the timing controller 21, the demultiplexer accordingly generates a channel selection signal $EN_{sel}$ to one of the selection circuits.

After receiving the analog voltage signals $V_{th(ch1)}$, $V_{th(ch2)}$, $V_{th(ch3)}$ from the pixel circuits (R-pixel circuit 271a, G-pixel circuit 271b, B-pixel circuit 271c), the S/H circuits 2311, 2313, 2315 and the gain amplifier 231c senses and scales down the analog voltage signals. In a case the demultiplexer and the selection modules 231b, 233b are utilized, the selection circuit receiving the channel selection signal $EN_{sel}$ is turned on so that the sensed and scaled analog voltage signals are bypassed to the ADCs 231a, 233a. Then, the ADCs 231a, 233a transform the scaled analog voltage signals into digitals signals representing ADC codes. The digital signals are further transmitted to the timing controller 21.

As the digital signals originated from the analog voltage signals $V_{th(ch1)}$, $V_{th(ch2)}$, $V_{th(ch3)}$ representing threshold voltages $V_{th}$ of the pixel circuits, the ADC codes can reflect statuses of the pixel circuits.

According to the embodiment of the present disclosure, the selection module 231b receives channel selection signals ENsel from the timing controller 21. Basically, the channel selection signals ENsel are separately corresponding to the S/H circuits 2311, 2313, 2315 and the S/H circuits 2311, 2313, 2314. With the channel selection signals ENsel, the ADC 231a rotatively generates the digital signals corresponding to the S/H circuits 2311, 2313, 2315. In consequence, the timing controller 21 is capable of separately and individually compensating each of the R-pixel circuits 271a, the G-pixel circuit 271b, and the B-pixel circuit 271c.

Figure 3:
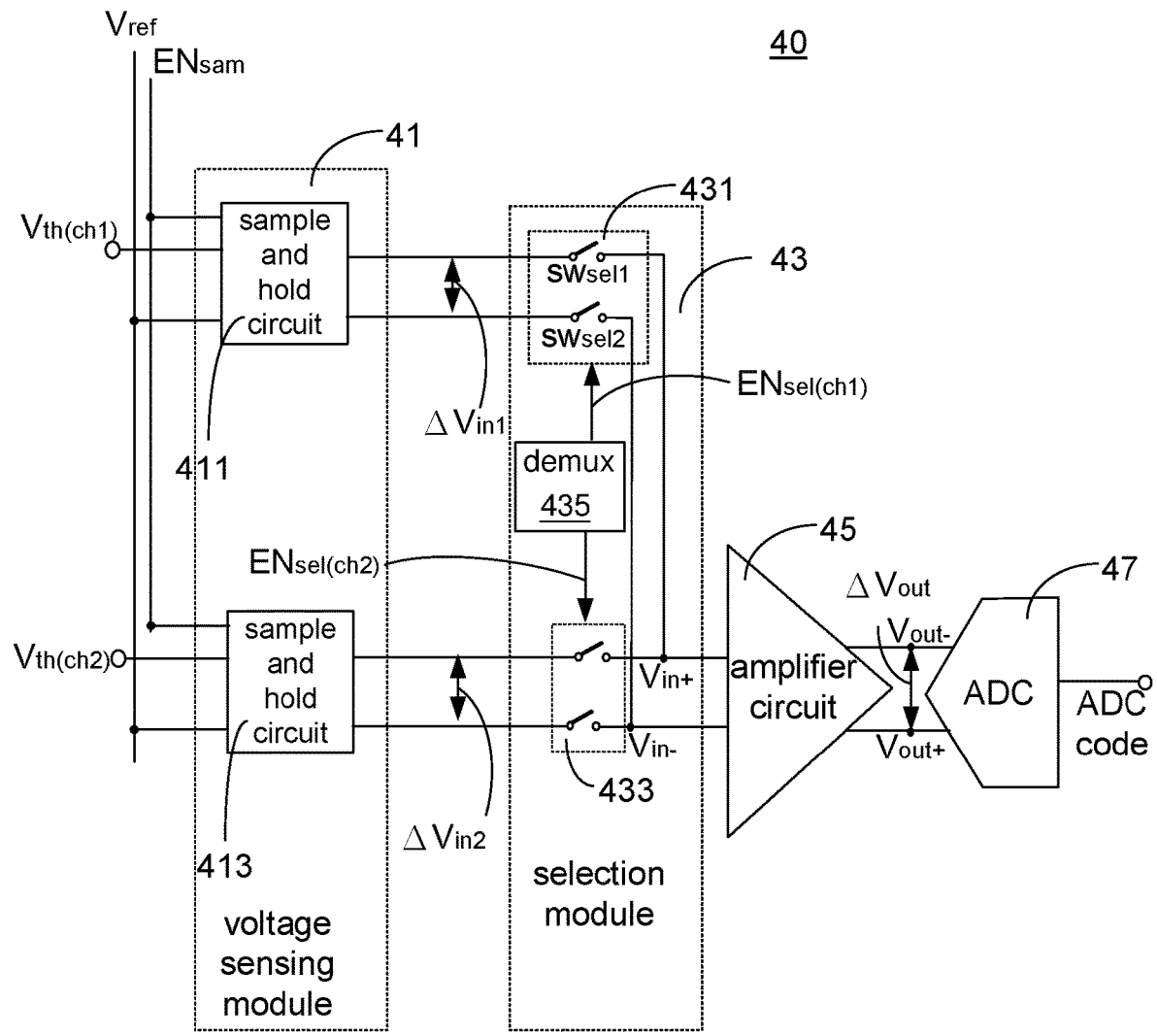
FIG. 3 shows a block diagram illustrating the sensing circuit according to an embodiment of the present disclosure.

FIG. 3 shows a block diagram illustrating the sensing circuit according to an embodiment of the present disclosure. The sensing circuit 40 includes a voltage sensing module 41, a selection module 43, an amplifier circuit 45, and an ADC 47.

For illustration purpose, the sensing circuit 40 in FIG. 3 is assumed to support two channels, and the invention is not limited to two channels. In accordance with the two channels, the voltage sensing module 41 includes two S/H circuits 411, 413, and the selection module 43 includes a demultiplexer 435 and two selection circuits 431, 433. The demultiplexer 435 is electrically connected to the selection circuits 431, 433, for generating the channel selection signal $EN_{sel1}$, $EN_{sel1}$ to respectively enable the selection circuits 431, 433.

The selection circuit 431 is electrically connected to the S/H circuit 411 and the amplifier circuit 45, and the selection switch 433 is electrically connected to the S/H circuit 413 and the amplifier circuit 45. The signals related to and operations of the separate channels are similar and only the first channel (ch1) is illustrated as example.

Figure 4:
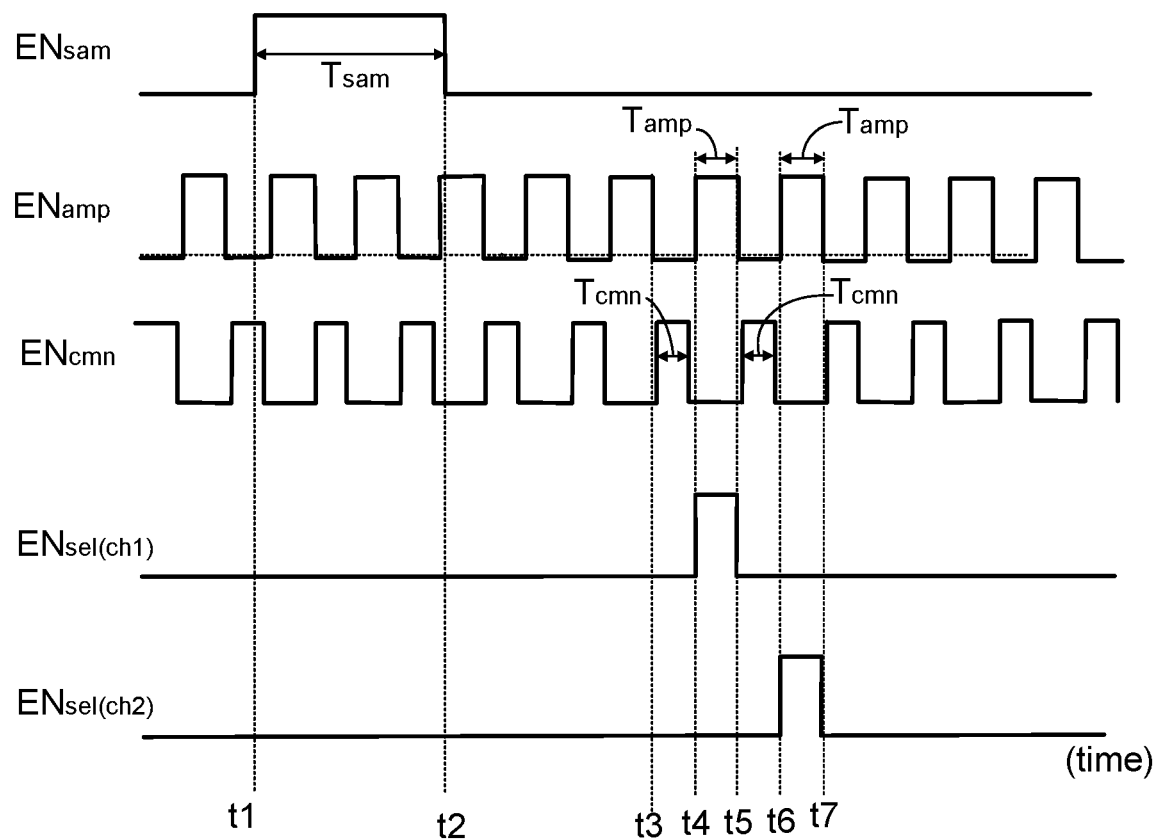
FIG. 4 is a waveform diagram showing signals related to the sensing circuit shown in FIG. 3.

The selection circuit 431 further includes a first selection switch swsel1 and a second selection switch swsel2. The first selection switch swsel1 and the second selection switch swsel2 conduct the output of the S/H circuit 411 to the amplifier circuit 45. Later, the amplifier circuit 45 generates the output voltage potential $\Delta V_{out}$ to the ADC 47. The ADC 47 then converts the output voltage potential $\Delta V_{out}$ to an ADC code and transmits the ADO code to the timing controller, FIG. 4 is a waveform diagram showing signals related to the sensing circuit shown in FIG. 3. The first waveform represents the sampling enable signal $EN_{sam}$, the second waveform is an amplification mode signal $EN_{amp}$, the third waveform is a common mode signal $EN_{cmn}$, and the fourth and the fifth waveforms represent the channel selection signals ($EN_{sel(ch1)}$, $EN_{sel(ch2)}$.

In FIG. 4, the sampling enable signal $EN_{sam}$ significantly transits from a low voltage level to a high voltage level at timepoint t1, and significantly transits from the high voltage level to the low voltage level at timepoint t2. A sampling duration $T_{sam}$ between timepoints t1 and t2 is corresponding the duration when the sampling enable signal $EN_{sam}$ is at the high voltage level. The S/H circuits 411, 413 are simultaneously enabled by the sampling enable signal $EN_{sam}$ during the sampling duration $T_{sam}$.

The S/H circuits 411, 413 simultaneously and respectively sample their corresponding analog voltage signals $V_{th(ch1)}$, $V_{th(ch2)}$ during the sampling duration $T_{sam}$. The S/H circuit 411 generates a pair of first channel differential input signals $(V_{in+(ch1)}, V_{in-(ch1)})$, and the S/H circuit 413 generates a pair of second channel differential input signals $(V_{in+(ch2)}, V_{in-(ch2)})$.

As the S/H circuits 411, 413 simultaneously receive the sampling enable signal $EN_{sam}$, the S/H circuits 411, 413 generate the pairs of differential input signals $(V_{in+(ch1)}, V_{in-(ch1)})$, $(V_{in+(ch2)}, V_{in-(ch2)})$ in a synchronized manner. That is, one pair of differential input signals $(V_{in+(ch1)}, V_{in-(ch1)})$, and another pair of differential input signals $(V_{in+(ch2)}, V_{in-(ch2)})$ are generated at the same time.

The timing controller transmits the common mode signal $EN_{cmn}$ and the amplification mode signal $EN_{amp}$ to the amplifier circuit 45. According to the embodiment of the present disclosure, the amplifier circuit 45 may operate in two modes, a common mode and an amplification mode.

When the common mode signal $EN_{cmn}$ is at the high voltage level, the amplifier circuit 45 operates in the common mode. The duration when the voltage level of the common mode signal $EN_{cmn}$ is at the high voltage level is defined as a common mode duration $T_{cmn}$. During the common mode duration $T_{cmn}$, the amplifier circuit 45 does not receive any of the differential input signals but merely receives common mode voltages $V_{cmn}$.

On the other hand, when the amplification mode signal $EN_{amp}$ is at the high voltage level, the amplifier circuit 45 operates in the amplification mode. The duration when the amplification mode signal $EN_{amp}$ is at the high voltage level is defined as an amplification mode duration $T_{amp}$. During the amplification mode duration $T_{amp}$, the amplifier circuit 45 receives and amplifies the differential input signals being received, and the amplifier circuit 45 generates and outputs the amplified signal based on the common mode voltages $V_{cmn}$ which are received in the common mode.

As shown in FIG. 4, the common mode signal $EN_{cmn}$ and the amplification mode signal $EN_{amp}$ periodically transits between the high voltage level and the low voltage level. To prevent signal confliction, the common mode duration $T_{cmn}$ and the amplification mode duration $T_{amp}$ are not overlapped. In practical design, the durations when the common mode signal $EN_{cmn}$ and the amplification mode signal $EN_{amp}$ are at the low voltage levels may be shortly overlapped. For the sake of illustration, such overlapped durations are not described below.

As shown in FIG. 4, a common mode duration $T_{cmn}$ exists between timepoint t3 and timepoint t4, an amplification mode duration $T_{amp}$ exits between timepoint t4 and timepoint t5, another common mode duration $T_{cmn}$ exists between timepoint t5 and timepoint t6, and another amplification mode duration $T_{amp}$ exists between timepoint t6 and timepoint t7.

Between timepoint t3 and timepoint t4 (the common mode duration $T_{cmn}$), the gain amplifier operates in the common mode and receives the common mode voltages $V_{cmn}$. The amplifier circuit 45 does not amplify nor generate different output signals in this duration.

Between timepoint t4 and timepoint t5 (the amplification mode duration $T_{amp}$), the amplifier circuit 45 operates in the amplification mode and receives the pair of differential input signals ($V_{in+}$, $V_{in-}$) from the selection circuit 431. Based on the common mode voltages, the amplifier circuit 45 amplifies the pair of differential input signals ($V_{in+}$, $V_{in-}$) received from the selection circuit 431 and generates a pair of differential output signals ($V_{opt+}$, $V_{out-}$) in this duration.

Between timepoint t5 and timepoint t6 (the another common mode duration $T_{cmn}$), the gain amplifier operates in the common mode and receives the common mode voltages $V_{cmn}$. The amplifier circuit 45 does not amplify nor generate different output signals in this duration.

Between timepoint t6 and timepoint t7 (the another amplification mode duration $T_{amp}$), the amplifier circuit 45 operates in the amplification mode and receives the pair of differential input signals ($V_{in+}$, $V_{in-}$) from the selection module 433. Based on the common mode voltages $V_{cmn}$, the amplifier circuit 45 amplifies the pair of differential input signals ($V_{in+}$, $V_{in-}$) received from the selection module 433 and generates another pair of differential output signals ($V_{out+}$, $V_{out-}$) in this duration.

During the sampling duration $T_{sam}$, the S/H circuits 411, 413 transform the analog voltage signals $V_{th(ch1)}$, $V_{th(ch2)}$ corresponding to different channels representing pixel circuits to different pairs of differential input signals ($V_{in+(ch1)}$, $V_{in-(ch1)}$), ($V_{in+(ch2)}$, $V_{in-(ch2)}$). The pairs of differential input signals ($V_{in+(ch1)}$, $V_{in-(ch1)}$), ($V_{in+(ch2)}$, $V_{in-(ch2)}$) are then transmitted afterwards. Then, the pairs of differential input signals are alternatively transmitted and further amplified by the amplifier circuit 45 during different amplification mode durations $T_{amp}$. Details of design and operation of the S/H circuit according to the embodiment of the present disclosure are illustrated below. For the sake of illustration, only one S/H circuit is illustrated as an example in the context.

Figure 5:
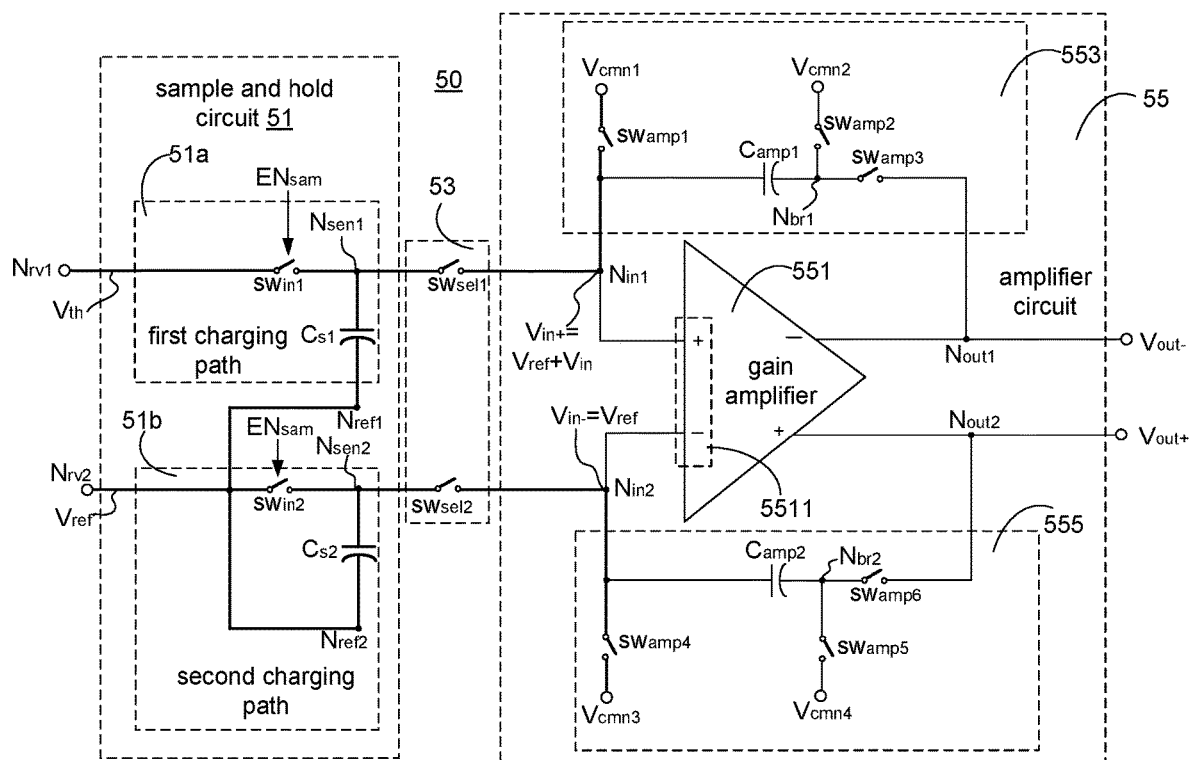
FIG. 5 is a schematic diagram illustrating an implementation of the sensing circuit.

FIG. 5 is a schematic diagram illustrating an implementation of the sensing circuit. The sensing circuit 50 includes a S/H circuit 51, a selection module including a selection circuit 53 corresponding to the S/H circuit 51, and an amplifier circuit 55.

After receiving an analog voltage signal $V_{th}$ corresponding to the pixel circuit, the S/H circuit 51 transforms the received analog voltage signal $V_{th}$ to the pair of differential input signals ($V_{in+}$, $V_{in-}$). The pair of differential input signals ($V_{in+}$, $V_{in-}$) are transmitted to the amplifier circuit 55 when the channel selection signal $EN_{sel}$ received by the selection circuit 53 is at the high voltage level.

The S/H circuit 51 includes a first charging path 51a and a second charging path 51b. The first charging path 51a includes a first input switch $sw_{in1}$ and a first sampling capacitor $C_{s1}$. The first input switch $sw_{in1}$ is electrically connected to a first receiving terminal $N_{rv1}$ and the first sensing terminal $N_{sen1}$, and the first sampling capacitor $C_{s1}$ is electrically connected to the first sensing terminal $N_{sen1}$ and a second receiving terminal $N_{rv2}$.

The second charging path 51b includes a second input switch $sw_{in2}$ and a second sampling capacitor $C_{s2}$. The second input switch $sw_{in2}$ is electrically connected to the second receiving terminal $N_{rv2}$ and the second sensing terminal $N_{sen2}$. The first sampling capacitor $C_{s1}$ and the second sampling capacitor $C_{s2}$ continuously receive the reference voltage $V_{ref}$ through the second receiving terminal $N_{rv2}$.

The first charging path 51a selectively generates the first charging potential $\Delta V_{in1}$ between a first sensing terminal $N_{sen1}$ and the first reference terminal $N_{ref1}$ according to the analog voltage signal $V_{th}$ and the reference voltage $V_{ref}$. The first input switch $sw_{in1}$ conducts the analog voltage signal $V_{th}$ to the first sensing terminal $sw_{in1}$ according to a sample enable signal $EN_{sam}$. The first sampling capacitor $C_{s1}$ receives the analog voltage signal $V_{th}$ through the first input switch $sw_{in1}$ and generates the first charging potential $\Delta V_{in1}$ when the first input switch $sw_{in1}$ is switched on. Accordingly, the non-inverting differential input signal $V_{in+}$ is generated at the first sensing terminal $N_{sen1}$.

The second charging path 51b selectively conducts the reference voltage $V_{ref}$ to a second sensing terminal $N_{sen2}$. The second input switch $sw_{in2}$ conducts the reference voltage $V_{ref}$ to the second sensing terminal $N_{sen2}$ according to the sample enable signal $EN_{sam}$. The second sampling capacitor $C_{s2}$ is electrically connected to the second sensing terminal $N_{sen2}$ and the second receiving terminal $N_{rv2}$. The second sampling capacitor $C_{s2}$ receives the reference voltage $V_{ref}$ through the second input switch $sw_{in2}$ and generate the second charging potential $\Delta V_{in2}$ when the second input switch $sw_{in2}$ is switched on. Accordingly, the inverting differential input signal $V_{in-}$ is generated at the second sensing terminal $N_{sen2}$.

As shown in FIG. 5, when the second input switch $sw_{in2}$ is switched on, both the two terminals of the second sampling capacitor $C_{s2}$ receive the reference voltage $V_{ref}$. Therefore, the second charging potential $\Delta V_{in2}$ across the second sampling capacitor $C_{s2}$ is equivalent to zero.

Relative to the operation range of the DAC, the analog input voltage $V_{th}$ is relatively high. Therefore, the first charging path 51a and the second charging path 51b are implemented by high voltage components. Unlike the components which can stand only low voltage (such as 1.8 volts), these high voltage components can receive a relatively greater range of input voltage (for example, 0~9 volts). In practical application, the voltage that these high voltage components can withstand may be varied with process. If the components can withstand a relatively high voltage, such components can be adopted. The voltage values that the high voltage components can withstand can be, for example, up to 9 volts, 13.5 volts, 18 volts, and so forth. It should be noted that these voltage values are illustrated as an example, not a limitation. According to the embodiment of the present disclosure, capacitances of the first sampling capacitor $C_{s1}$ and the second sampling capacitor $C_{s2}$ are equivalent.

The first selection switch sw$_{sel1}$ is electrically connected to the first sensing terminal N$_{sen1}$ and the first input terminal N$_{in1}$. The second selection switch sw$_{sel1}$ is electrically connected to the second sensing terminal N$_{sen2}$ and the second input terminal N$_{in2}$. The first selection switch sw$_{sel1}$ and the second selection switch sw$_{sel1}$ respectively conduct the voltages at the first sensing terminal N$_{sen1}$ and the second sensing terminal N$_{sen2}$ to the first input terminal N$_{in1}$ and the second input terminal N$_{in2}$.

The first and the second selection switches sw$_{sel1}$, sw$_{sel2}$ in the same selection circuit are controlled by the same channel selection signal. Therefore, the pair of differential input signals (V$_{in+}$, V$_{in-}$) are transmitted to the gain amplifier 551 simultaneously. According to the embodiment of the present disclosure, the first selection switch sw$_{sel1}$ and the second selection switch sw$_{sel2}$ are implemented by the high voltage components.

The amplifier circuit 55 includes a first input terminal N$_{in1}$, a second input terminal N$_{in2}$, a first output terminal N$_{out1}$, a second output terminal N$_{out2}$, a gain amplifier 551, a first conduction path 553 and a second conduction path 555.

The gain amplifier 551 receives the pair of differential input signals (V$_{in+}$, V$_{in-}$) through the first and the second input terminals N$_{in1}$, N$_{in2}$ and generate a pair of differential output signals (V$_{out+}$, V$_{out-}$) at the first and the second output terminals N$_{out1}$, N$_{out2}$. The first conduction path 553 is electrically connected to the first input terminal N$_{in1}$ and the first output terminal N$_{out1}$. The second conduction path 555 is electrically connected to the second input terminal N$_{in2}$ and the second output terminal N$_{out2}$.

The first input terminal N$_{in1}$ can be a non-inverting input terminal (+) of the gain amplifier 55, and the second input terminal N$_{in2}$ can be an inverting input terminal (−) of the gain amplifier 551. The first output terminal N$_{out1}$ can be an inverting output terminal (−) of the gain amplifier 551, and the second output terminal N$_{out2}$ can be a non-inverting output terminal (+) of the gain amplifier 551.

In FIG. 5, the first conduction path 553 and the second conduction path 555 are arranged at the upper side and the lower side of the gain amplifier 551, respectively.

The first conduction path 553 includes amplifier switches sw$_{amp1}$, sw$_{amp2}$, sw$_{amp3}$ and an amplifier capacitor C$_{amp1}$. The amplifier switch sw$_{amp1}$ is electrically connected to the first input terminal N$_{in1}$ and the positive terminal of the amplifier capacitor C$_{amp1}$. The amplifier switch sw$_{amp2}$ is electrically connected to a first branch terminal N$_{br1}$. The amplifier switch sw$_{amp3}$ is electrically connected to the first branch terminal N$_{br1}$ and the first output terminal N$_{out1}$. The amplifier capacitor C$_{amp1}$ is electrically connected to the first input terminal N$_{in1}$ and the first branch terminal N$_{br1}$. Depending on the operation mode of the gain amplifier 551, switching statuses of the amplifier switches in the first conduction path 553 may change.

The second conduction path 555 includes amplifier switches sw$_{amp4}$, sw$_{amp5}$, Sw$_{amp6}$ and an amplifier capacitor C$_{amp2}$. The amplifier switch sw$_{amp4}$ is electrically connected to the second input terminal N$_{in2}$. The amplifier switch sw$_{amp5}$ is electrically connected to a second branch terminal N$_{br2}$. The amplifier switch sw$_{amp6}$ is electrically connected to the second branch terminal N$_{br2}$ and the second output terminal N$_{out2}$. The amplifier capacitor C$_{amp2}$ is electrically connected to the second input terminal N$_{in2}$ and the second branch terminal N$_{br2}$. Depending on the operation mode of the gain amplifier 551, switching statuses of the amplifier switches in the second conduction path 555 may change.

When the gain amplifier 551 operates in the common mode, the first conduction path 553 receives the common mode voltages V$_{cmn1}$, V$_{cmn2}$, and the second conduction path 555 receives the common mode voltages V$_{cmn3}$, V$_{cmn4}$. Therefore, charges are accumulated in the amplifier capacitor C$_{amp1}$ based on the common modes voltage V$_{cmn1}$, V$_{cmn2}$, and charges are accumulated in the amplifier capacitor C$_{cmp2}$ based on the common mode voltages V$_{cmn3}$, V$_{cmn4}$.

When the gain amplifier 551 is in the amplification mode, the first conduction path 553 generates the inverting differential output signal V$_{out-}$ based on the common mode voltages V$_{cmn1}$, V$_{cmn2}$ and the pair of differential input signals (V$_{in+}$, V$_{in-}$), and the second conduction path 555 generates the non-inverting differential output signal V$_{out+}$ based on the common mode voltages V$_{cmn3}$, V$_{cmn4}$ and the pair of differential input signals (V$_{in+}$, V$_{in-}$). The inverting differential output signal V$_{out-}$ is generated based on the pair of differential input signals (V$_{in+}$, V$_{in-}$) and the charges accumulated in the amplifier capacitor C$_{amp1}$, and the non-inverting differential output signal V$_{out+}$ is generated based on the pair of differential input signals (V$_{in+}$, V$_{in-}$) and the charges accumulated in the amplifier capacitor C$_{amp2}$.

According to the embodiment of the present disclosure, components in the first conduction path 553 and the second conduction path 555 operate in a symmetric manner. Operations of the amplifier switches sw$_{amp1}$, sw$_{amp2}$, sw$_{amp3}$ and the amplifier capacitor C$_{amp1}$ are symmetric to operations of the amplifier switches sw$_{amp4}$, sw$_{amp5}$, sw$_{amp5}$ and the amplifier capacitor C$_{amp2}$, respectively.

Values of the common mode voltages V$_{cmn1}$, V$_{cmn2}$, V$_{cmn3}$, V$_{cmn1}$ are related to several parameters such as swing of signals and supply voltage. For example, in a case that the input signals are differential, the gain amplifier is utilized as a buffer, and the common mode voltages V$_{cmn1}$, V$_{cmn2}$, V$_{cmn3}$, V$_{cmn4}$ satisfy the following relationships, that is, V$_{cmn1}$=V$_{cmn3}$ and V$_{cmn2}$=V$_{cmn1}$. In another case that the input signals are not differential, the common mode voltages V$_{cmn1}$, V$_{cmn2}$, V$_{cmn3}$, V$_{cmn4}$ can be set to generate differential output signals (for example, V$_{cmn1}$=V$_{cmn3}$=$_{cmn4}$=0.4V, and V$_{cmn2}$=0.9V).

According to the embodiment of the present disclosure, the gain amplifier 551 is capable of scaling the pair of differential input signals V$_{in+}$, V$_{in-}$ and generating the pair of differential output signals (V$_{out+}$, V$_{out-}$) whose voltages are within the operation range of the DAC. The voltage levels of the differential input signals V$_{in+}$, V$_{in-}$ may be relatively high. As being connected to the first and the second input terminals N$_{in1}$, N$_{in2}$ for receiving the differential input signals V$_{in+}$, V$_{in-}$ having the relatively high voltage level, the amplifier switches sw$_{amp1}$, sw$_{amp4}$ are implemented by the high voltage components.

Figure 6:
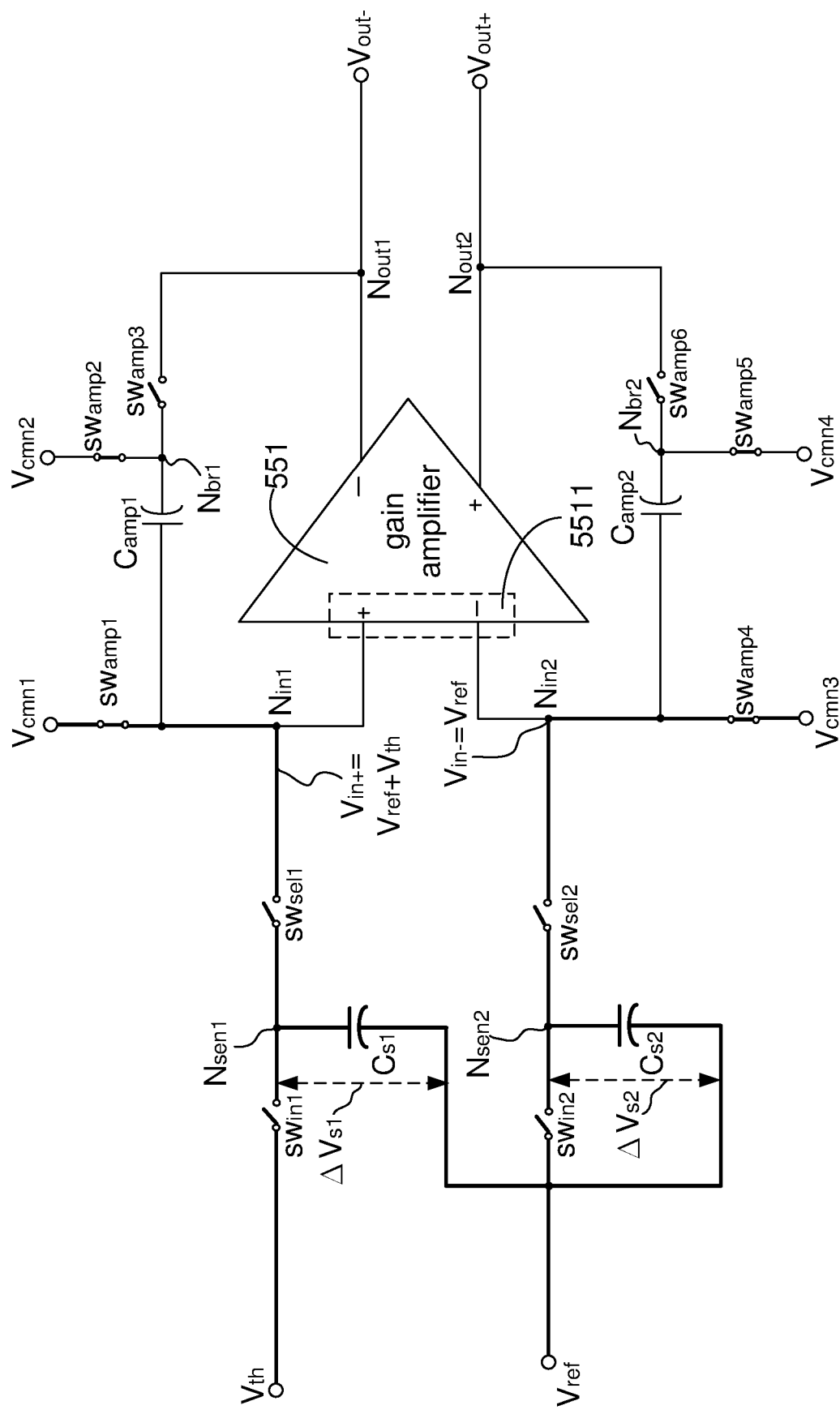
FIG. 6 is a schematic diagram illustrating operation of the amplifier circuit in the common mode.
Figure 7:
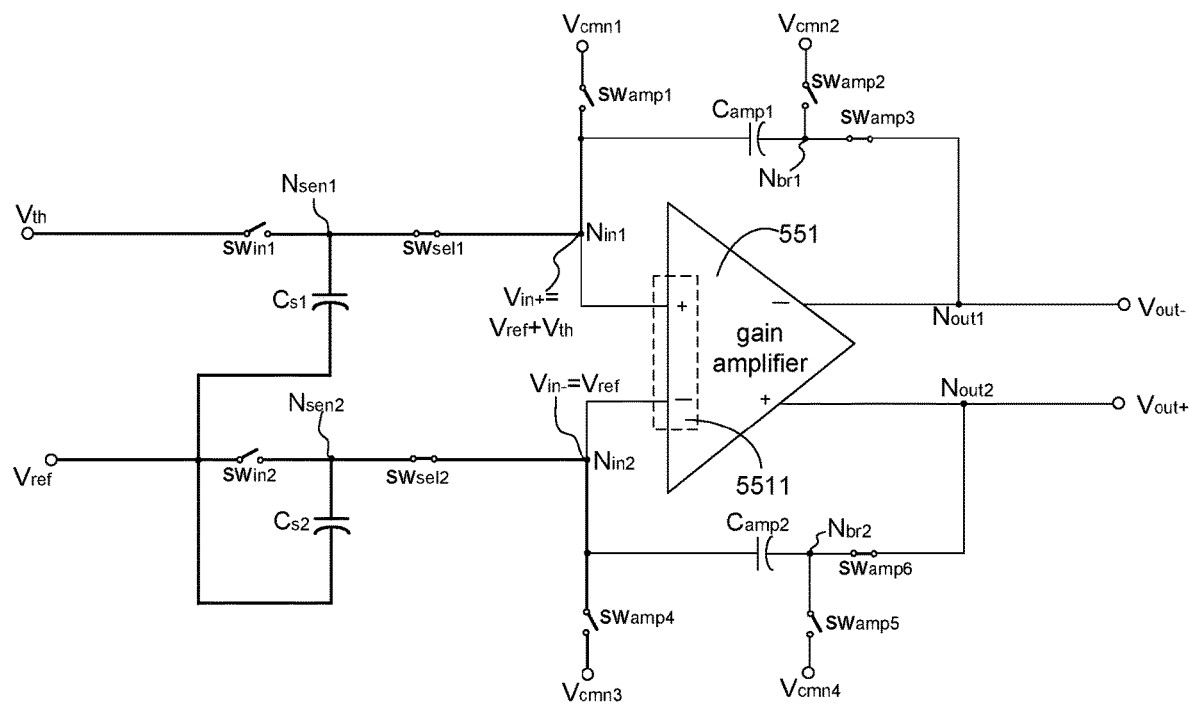
FIG. 7 is a schematic diagram illustrating operation of the amplifier circuit in the amplification mode.

Depending on operation mode of the gain amplifier 551, interconnections of the amplifier circuit 55 may change. FIGS. 6 and 7 respectively corresponds to the interconnections of the amplifier circuit 55 operating in the common mode and the amplification mode.

FIG. 6 is a schematic diagram illustrating operation of the amplifier circuit in the common mode. According to the embodiment of the present disclosure, the gain amplifier 551 does not generate the pair of differential output signals ($V_{out+}$, $V_{out-}$) when the gain amplifier 551 operates in the common mode.

When the gain amplifier 551 operates in the common mode, the amplifier switches $sw_{amp1}$, $sw_{amp2}$ are switched on, and the amplifier switch $sw_{amp3}$ is switched off. The amplifier switch $sw_{amp1}$ conducts the common mode voltage $V_{cmn1}$ to the first input terminal $N_{in1}$, and the amplifier switch $sw_{amp2}$ conducts the common mode voltage $V_{cmn2}$ to the first branch terminal $N_{br1}$. Therefore, the amplifier capacitor $C_{amp1}$ is charged by the common mode voltages $V_{cmn1}$, $V_{cmn2}$.

When the gain amplifier 551 operates in the common mode, the amplifier switches $sw_{amp4}$, $sw_{amp5}$ are switched on, and the amplifier switch $sw_{amp6}$ is switched off. The amplifier switch $sw_{amp4}$ conducts the common mode voltage $V_{cmn3}$ to the second input terminal $N_{in2}$, and the amplifier switch $sw_{amp5}$ conducts the common mode voltage $V_{cmn4}$ to the second branch terminal $N_{br2}$. Therefore, the amplifier capacitor $C_{amp2}$ is charged by the common mode voltages $V_{cmn3}$, $V_{cmn4}$.

FIG. 7 is a schematic diagram illustrating operation of the amplifier circuit in the amplification mode. According to the embodiment of the present disclosure, the gain amplifier 551 generates the pair of differential output signals ($V_{out+}$, $V_{out-}$) when operating in the amplification mode.

When the gain amplifier 551 operates in the amplification mode, the amplifier switches $sw_{amp1}$, $sw_{amp2}$, $sw_{amp4}$, $sw_{amp5}$ are switched off, and the amplifier switches $sw_{amp3}$, $sw_{amp6}$ are switched on. The amplifier switch $sw_{amp3}$ conducts the first branch terminal $N_{br1}$ to the first output terminal $N_{out1}$, and the amplifier switch $sw_{amp6}$ conducts the second branch terminal $N_{br2}$ to the second output terminal $N_{out2}$.

Figure 8:
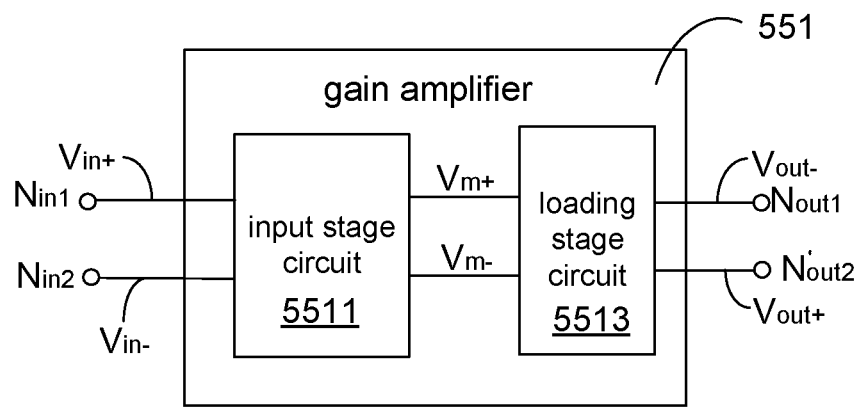
FIG. 8 is a block diagram illustrating structure of the gain amplifier.

FIG. 8 is a block diagram illustrating structure of the gain amplifier. The gain amplifier 551 includes an input stage circuit 5511 and a loading stage circuit 5513. The input stage circuit 5511 is electrically connected to the first input terminal $N_{in1}$ and the second input terminal $N_{in2}$. The loading stage circuit 551 is electrically connected to the input stage circuit 551, the first output terminal $N_{out1}$, and the second output terminal $N_{out2}$.

Figure 9A:
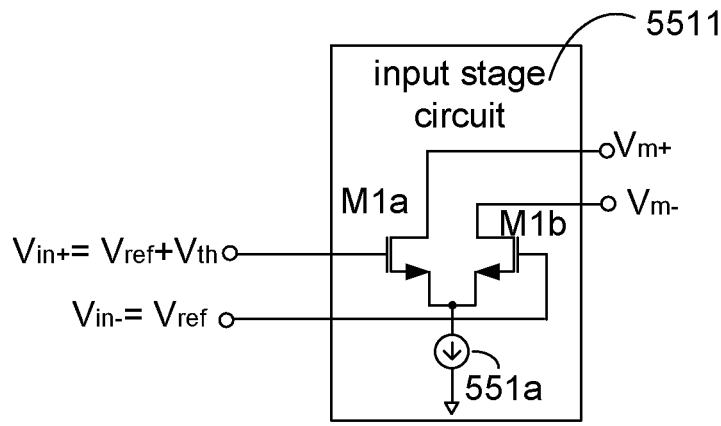
FIG. 9A is a schematic diagram illustrating the input stage circuit using NMOS transistor.

FIG. 9A is a schematic diagram illustrating the input stage circuit using n-channel metal-oxide-semiconductor field-effect (hereinafter; NMOS) transistor. In FIG. 9A, the input stage circuit 5511 is assumed to include a current source 551a and differential input transistors M1a, M1b which are high-voltage NMOS transistors.

Figure 9B:
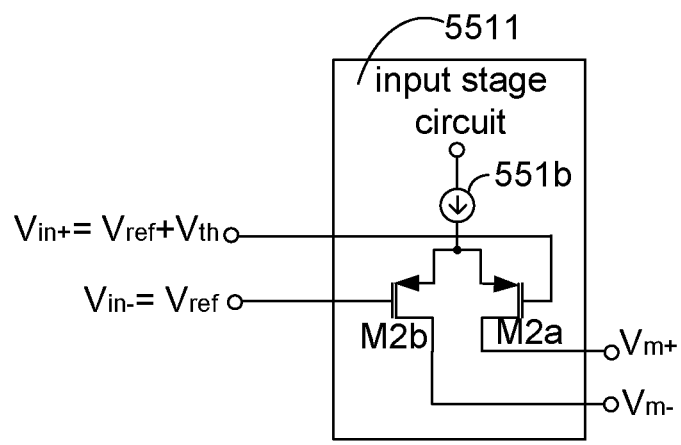
FIG. 9B is a schematic diagram illustrating the input stage circuit using PMOS transistor.

FIG. 9B is a schematic diagram illustrating the input stage circuit using p-channel metal-oxide-semiconductor field-effect (hereinafter, PMTS) transistor. In FIG. 9B, the input stage circuit 5511 is assumed to include a current source 551b and differential input transistors M2a, M2b which are high-voltage PMOS transistors.

As shown in FIGS. 9A and 9B, gates of the differential input transistors M1a, M2a receive the non-inverting differential input signal and gates of the differential input transistors M1b, M2b receive the inverting differential input signal $V_{in-}$. Sources of the differential input transistors M1a, M2a and the differential input transistors M1b, M2b are electrically connected to the current sources 551a, 551b, Drains of the differential input transistors M1a, M2a generate and provide a first middle stage differential signal $V_{m+}$ to the loading stage circuit 5513. Drains of the differential input transistors M1b, M2b generate and provide a second middle stage differential signal $V_{m-}$ to the loading stage circuit 5513.

Figure 10:
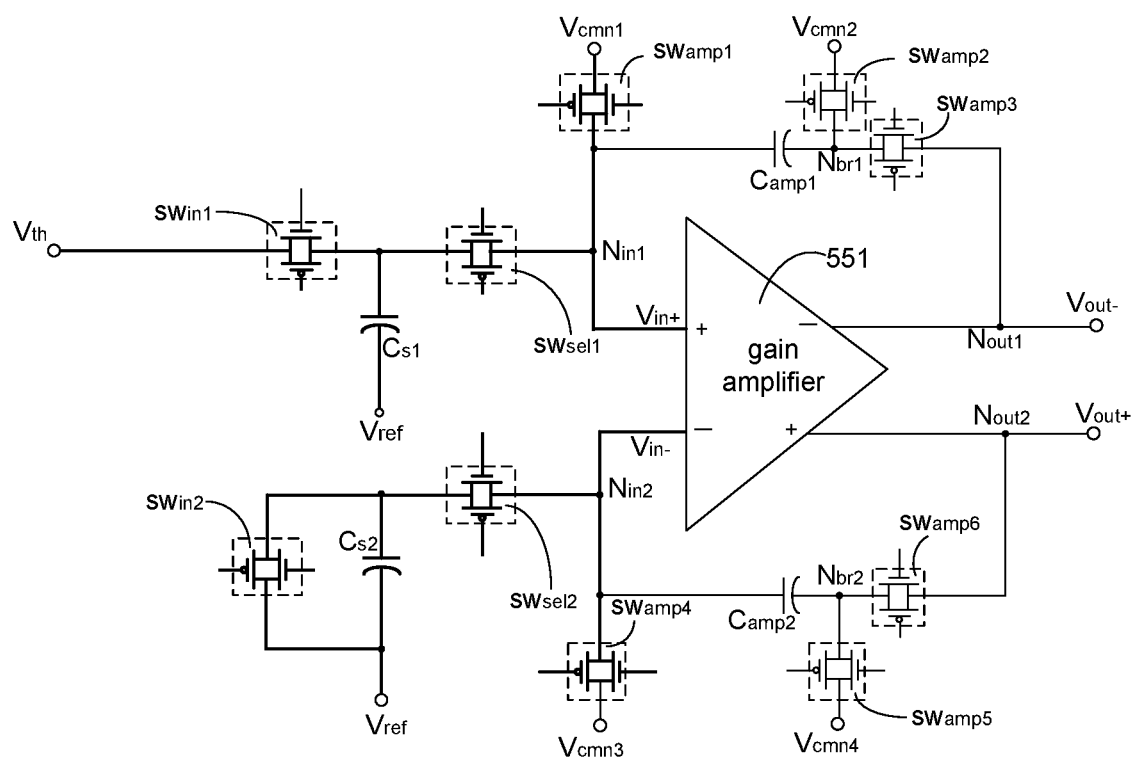
FIG. 10 is a schematic diagram illustrating implementation the sample and hold circuit according to the embodiment of the present disclosure.

FIG. 10 is a schematic diagram illustrating implementation the S/H circuit according to the embodiment of the present disclosure. As shown in FIG. 10, the first input switch $sw_{in1}$, the second input switch $sw_{in2}$, the first selection switch $sw_{sel1}$, the second selection switch $sw_{sel2}$, the amplifier switches $sw_{amp1}$, $sw_{amp2}$, $sw_{amp3}$, $sw_{amp4}$, $sw_{amp5}$, $sw_{amp6}$ can be transmission gates.

According to the embodiment of the present disclosure, components in the S/H circuit and some of the components in the sensing circuit are implemented with high voltage components. With the use of the high voltage components, the gain amplifier can directly receive the relatively high voltage of the pair of the differential input signals ($V_{in+}$, $V_{in-}$). Then, the gain amplifier is capable of directly generating the pair of differential output signals ($V_{out+}$, $V_{out-}$) with the relatively lower voltage range. The amplification ratio between the differential output signals ($V_{out+}$, $V_{out-}$) and the differential input signals ($V_{in+}$, $V_{in-}$) can be freely designed, depending on what the specification of the sensing circuit requires, without using an extra scaling circuit. The amplification ratio can be, for example, 2/3. As the scaling circuit is not required, using the high voltage components allows the sensing circuit to be implemented with less area. Considering that the amount of the pixel circuits being included in the display panel, the area required for implementing the sensing circuit can be dramatically reduced.

Although the illustrations above are based on the OLED display panel, but the application of the present disclosure is not limited, Therefore, if there is a need of other display devices having the analog voltage signal to be scaled down, the embodiment of the present disclosure can be modified and applied.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sensing circuit of display driver, comprising:
   a sample and hold circuit, for transforming an analog voltage signal corresponding to a pixel circuit to a pair of differential input signals, comprising:
   a first charging path, configured to selectively generate a first charging potential between a first sensing terminal and a first reference terminal according to the analog voltage signal and a reference voltage, wherein one of the pair of differential input signals is generated at the first sensing terminal; and
   a second charging path, configured to selectively conduct the reference voltage to a second sensing terminal, wherein the other one of the pair of differential input signals is generated at the second sensing terminal,
   wherein the first charging path and the second charging path are implemented by high voltage components;
   a gain amplifier, electrically connected to the sample and hold circuit, comprising:
   a first input terminal;
   a second input terminal;
   a first output terminal;
   a second output terminal; and
   an input stage circuit, electrically connected to the first input terminal and the second input terminal, comprising:

a current source;
a first differential input transistor; and
a second differential input transistor, wherein the first differential input transistor and the second differential input transistor are implemented by the high voltage components, wherein the gain amplifier is configured to receive the pair of differential input signals through the first and the second input terminals and generate a pair of differential output signals at the first and the second output terminals;
a first conduction path, electrically connected to the first input terminal and the first output terminal, configured to receive a first common mode voltage and a second common mode voltage when the gain amplifier is in a common mode, and generate one of the pair of differential output signals based on the first common mode voltage, the second common mode voltage and the pair of differential input signals when the gain amplifier is in an amplification mode; and
a second conduction path, electrically connected to the second input terminal and the second output terminal, configured to receive a third common mode voltage and a fourth common mode voltage when the gain amplifier is in the common mode, and generate the other one of the pair of differential output signals based on the third common mode voltage, the fourth common mode voltage, and the pair of differential input signals when the gain amplifier is in the amplification mode.

2. The sensing circuit according to claim 1, further comprising:
a selection module, comprising a demultiplexer and a plurality of selection circuits, wherein each of the plurality of selection circuits comprises:
a first selection switch, electrically connected to the demultiplexer, the first sensing terminal and the first input terminal, configured to conduct the one of the pair of differential input signals to the first input terminal when a channel selection signal is at a first voltage level; and
a second selection switch, electrically connected to the demultiplexer, the second sensing terminal and the second input terminal, configured to conduct the other one of the pair of differential input signals to the second input terminal when the channel selection signal is at the first voltage level,
wherein the first selection switch and the second selection switch are implemented by the high voltage components, and the first selection switch and the second selection switch receive the channel selection signal from the demultiplexer.

3. The sensing circuit according to claim 1, wherein the first charging path comprises:
a first input switch, electrically connected to a first receiving terminal and the first sensing terminal, configured to conduct the analog voltage signal to the first sensing terminal according to a sample enable signal; and
a first sampling capacitor, electrically connected to the first sensing terminal and a second receiving terminal, configured to receive the analog voltage signal through the first input switch and generate the first charging potential when the first input switch is switched on.

4. The sensing circuit according to claim 3, wherein the second charging path comprises:
a second input switch, electrically connected to the second receiving terminal and the second sensing terminal, configured to conduct the reference voltage to the second sensing terminal according to the sample enable signal; and
a second sampling capacitor, electrically connected to the second sensing terminal and the second receiving terminal, configured to receive the reference voltage through the second input switch and generate a second charging potential when the second input switch is switched on.

5. The sensing circuit according to claim 4, wherein the first sampling capacitor and the second sampling capacitor continuously receive the reference voltage through the second receiving terminal, and the second charging potential is equivalent to zero.

6. The sensing circuit according to claim 4, wherein capacitance of the first sampling capacitor is equivalent to capacitance of the second sampling capacitor.

7. The sensing circuit according to claim 1, wherein the gain amplifier is electrically connected to an analog-to-digital converter, wherein the analog-to-digital converter receives the pair of differential output signals and accordingly generates a digital signal.

8. The sensing circuit according to claim 7, wherein the sensing circuit is electrically connected to a timing controller and a display panel comprising a plurality of pixel circuits, wherein the sensing circuit receives the analog voltage signal from one of the plurality of pixel circuits and conducts the digital signal to the timing controller so that the timing controller compensates the one of the plurality of pixel circuits based on the digital signal.

9. The sensing circuit according to claim 1, wherein
the first and the second differential input transistors are PMOS transistors; or
the first and the second differential input transistors are NMOS transistors.

10. The sensing circuit according to claim 1, wherein the gain amplifier further comprises:
a loading stage circuit, electrically connected to the input stage circuit, the first output terminal, and the second output terminal.

11. The sensing circuit according to claim 1, wherein the first conduction path comprises:
a first amplifier switch, electrically connected to the first input terminal, configured to conduct the first common mode voltage to the first input terminal when the gain amplifier is in the common mode, wherein the first amplifier switch is implemented by the high voltage components;
a second amplifier switch, electrically connected to a first branch terminal, configured to conduct the second common mode voltage to the first branch terminal when the gain amplifier is in the common mode;
a third amplifier switch, electrically connected to the first branch terminal and the first output terminal, configured to conduct the first branch terminal to the first output terminal when the gain amplifier is in the amplification mode; and
a first amplifier capacitor, electrically connected to the first input terminal and the first branch terminal.

12. The sensing circuit according to claim 11, wherein
charges are accumulated in the first amplifier capacitor based on the first common mode voltage and the second common mode voltage when the gain amplifier is in the common mode; and
the one of the pair of differential output signals is generated based on the pair of differential input signals and the charges accumulated in the first amplifier capacitor when the gain amplifier is in the amplification mode.

13. The sensing circuit according to claim 1, wherein the second conduction path comprises:
- a fourth amplifier switch, electrically connected to the second input terminal, configured to conduct the third common mode voltage to a second input terminal when the gain amplifier is in the common mode, wherein the fourth amplifier switch is implemented by the high voltage components;
- a fifth amplifier switch, electrically connected to a second branch terminal, configured to conduct the fourth common mode voltage to the second branch terminal when the gain amplifier is in the common mode;
- a sixth amplifier switch, electrically connected to the second branch terminal and the second output terminal, configured to conduct the second branch terminal to the second output terminal when the gain amplifier is in the amplification mode; and
- a second amplifier capacitor, electrically connected to the second input terminal and the second branch terminal.

14. The sensing circuit according to claim 13, wherein
- charges are accumulated in the second amplifier capacitor based on the third common mode voltage and the fourth common mode voltage when the gain amplifier is in the common mode; and
- the other one of the pair of differential output signals is generated based on the pair of differential input signals and the charges accumulated in the second amplifier capacitor when the gain amplifier is in the amplification mode.

15. The sensing circuit according to claim 1, wherein the first input terminal is a non-inverting input terminal of the gain amplifier, and the second input terminal is an inverting input terminal of the gain amplifier.

16. The sensing circuit according to claim 1, wherein the high voltage components are capable of withstanding 18 volts.

* * * * *